United States Patent [19]

Mance

[11] Patent Number: 5,139,818
[45] Date of Patent: Aug. 18, 1992

[54] METHOD FOR APPLYING METAL CATALYST PATTERNS ONTO CERAMIC FOR ELECTROLESS COPPER DEPOSITION

[75] Inventor: Andrew M. Mance, Royal Oak, Mich.

[73] Assignee: General Motors Corporation, Detroit, Mich.

[21] Appl. No.: 710,864

[22] Filed: Jun. 6, 1991

[51] Int. Cl.⁵ .................. B05D 3/06; B05D 5/12; B05D 3/02; G03C 5/00
[52] U.S. Cl. .................... 427/54.1; 427/96; 427/125; 427/229; 427/305; 430/198; 430/294; 430/330; 430/350
[58] Field of Search .................. 427/43.1, 53.1, 54.1, 427/96, 98, 125, 304, 305, 229, 383.5; 430/198, 270, 294, 311, 346, 350, 945, 330

[56] References Cited

U.S. PATENT DOCUMENTS

| | | | |
|---|---|---|---|
| 4,201,719 | 5/1980 | Liang | 260/429 R |
| 4,268,536 | 5/1981 | Beckenbaugh et al. | 427/54.1 |
| 4,481,236 | 11/1984 | Forsterling | 427/97 |
| 4,574,095 | 3/1986 | Baum et al. | 427/53.1 |
| 4,622,069 | 11/1986 | Akai et al. | 427/229 |
| 4,650,108 | 3/1987 | Gallagher | 427/229 |
| 4,686,114 | 8/1987 | Halliwell et al. | 427/54.1 |
| 4,808,274 | 2/1989 | Nguyen | 427/96 |
| 4,962,088 | 10/1990 | Micheli et al. | 505/1 |

OTHER PUBLICATIONS

T. H. Baum, "Photochemically Generated Gold Catalyst for Selective Electroless Plating of Copper", *J. Electrochem. Soc.*, vol. 137, No. 1, pp. 252–255 (1990).

*Primary Examiner*—Marianne Padgett
*Attorney, Agent, or Firm*—Robert J. Wallace

[57] ABSTRACT

Photochemical and electroless metallization techniques have been combined to create high resolution circuits with line widths and spaces of about one mil on alumina substrates. In this process, small amounts of a xylene-soluble platinum metallo-organic compound are first applied to the surface of the alumina substrate. A mask is then used to selectively expose the platinum metallo-organic compound to ultraviolet light in the areas that are to be metallized, so as to transform the platinum metallo-organic compound into a xylene-insoluble form. After a xylene rinse removes the original soluble platinum compound from the unexposed areas, the substrate is fired in air at about 450° C. for about five minutes, so as to pyrolize the insoluble, irradiated platinum metallo-organic compound into catalytically active platinum. This is followed by electroless deposition of copper onto the ultraviolet-treated regions where the catalytically active platinum resides.

13 Claims, No Drawings

METHOD FOR APPLYING METAL CATALYST PATTERNS ONTO CERAMIC FOR ELECTROLESS COPPER DEPOSITION

The present invention generally relates to methods for the formation of copper interconnections on printed circuit boards using electroless copper deposition techniques. More particularly, this invention relates to a method for providing patterned fine line, high resolution, geometries of electrolessly deposited metal on such a printed circuit board, wherein these fine line metal geometries are produced by the selective irradiation of a hydrocarbon-soluble metallo-organic platinum compound which renders the selective regions hydrocarbon-insoluble and which after appropriate firing transforms those regions into catalytically active platinum, to facilitate the subsequent electroless deposition of the metal.

BACKGROUND OF THE INVENTION

It is common within the electronics industry to use printing methods, such as silk-screening, for the formation of the copper interconnection lines during the manufacturing of printed circuit boards. Although these printing methods are generally satisfactory for most uses, they are characterized by resolution limits that will not meet future requirements for these types of circuits. In particular, these printing techniques are limited to line widths of about 0.005 inches (five mils). It is foreseeable that eventually these printed circuit board interconnects will necessitate line widths and spacings which are significantly smaller, about three mils, than present standards. In addition, it is believed that ultimately the industry will seek line widths and spacings on the order of about one mil.

Electroless copper deposition is a useful method for metallizing electrically non-conductive substrates, such as the alumina substrates commonly employed within a printed circuit board. A catalyzed surface must be present on the electrically non-conductive substrate in order to initiate the electroless deposition. The most often used catalysts consist of palladium with small amounts of tin. Silver can also be substituted for the palladium, however it is generally less preferred since relatively large amounts of the silver must be present to initiate the catalysis of the electroless copper bath. In addition, copper colloids have been used for these types of catalysts.

An advantageous feature of electroless deposition is that after the electrically non-conductive substrate has been catalyzed, there is no need for further use of the special catalyst. The freshly deposited metal surfaces become the electroless catalysts, therefore, the new metal forming on top of the catalyst actually becomes the catalyst for further build-up of metal. Thus the electroless deposition process, once begun, is self sustaining.

However, although the electroless deposition method is advantageous in some respects, there is a significant drawback to its widespread use—that drawback is the requirement that a catalytically active surface be present so as to initiate the electroless deposition. During the electroless deposition, the metal will deposit only where the catalytically active material is present. Therefore, the resolution of the subsequently deposited metal geometries is determined by (and corresponds directly to) the technique employed to deposit the catalyst material.

Therefore what is needed is a method for depositing the metal catalyst prior to the electroless deposition of copper which avoids the shortcomings of the prior art. In particular, the method for depositing the metal catalyst must be capable of providing fine line, high resolution, geometries characterized by line widths on the order of about one mil.

SUMMARY OF THE INVENTION

It is therefore an object of this invention to provide an improved method for selectively depositing the catalytically active material prior to the electroless deposition of copper or other electrolessly deposited metal, which results in the formation of fine line, high resolution, geometries of that metal, such as for use on a printed circuit board.

It is a further object of this invention that such a method provide fine line, high resolution, geometries characterized by line widths on the order of about one mil.

Lastly, it is still a further object of this invention that such an improved method for selectively depositing the catalytically active material prior to the subsequent electroless deposition of copper, utilize irradiation of a platinum-containing metallo-organic compound to effect the desired fine line, high resolution, geometries.

In accordance with a preferred embodiment of this invention, these and other objects and advantages are accomplished as follows.

According to the present invention, there is provided a method for selectively applying fine line, high resolution, geometries of catalytically active platinum onto a ceramic substrate for the subsequent catalysis of electroless metallization on that substrate.

Generally, a xylene-soluble platinum-containing metallo-organic compound is selectively patterned using ultraviolet radiation. The radiation converts the platinum metallo-organic compound into a xylene-insoluble catalyst precursor. After the original (unexposed) xylene-soluble metallo-organic compound is dissolved and removed from all areas of the substrate, the xylene-insoluble catalyst precursor is transformed into an active catalyst during a firing step.

In particular, first, a film of the preferred metallo-organic solution is deposited onto an appropriate substrate, such as alumina. The preferred metallo-organic solution is a xylene-soluble platinum metallo-organic compound wherein the organic component is preferably an amine ligand.

Next, the preferred platinum metallo-organic compound is selectively irradiated with ultraviolet light for a duration sufficient to transform the xylene-soluble, metallo-organic platinum compound into a xylene-insoluble form. The duration of irradiation required to achieve this transformation is extremely short, typically on the order of less than about one second. In addition, the filters employed to effect the selective irradiation of the substrate, are characterized by fine line, high resolution, geometries which selectively transmit the ultraviolet radiation to the underlying platinum metallo-organic compound, thereby resulting in fine line, high resolution, geometries of irradiated platinum metallo-organic compound. The xylene-soluble material is then removed from all areas of the substrate which were not exposed to the irradiation. The xylene-insoluble material is sufficiently adherent to the underlying substrate at this point.

Next, the xylene-insoluble, platinum metallo-organic compound (or photoproduct) is pyrolized in an oxygen-containing environment at a temperature sufficient to thermally decompose the platinum metallo-organic compound into corresponding regions of catalytically active platinum. This pyrolization temperature preferably ranges between about 300° C. and about 1000° C. It is to be noted that the catalytically active platinum exists only in those regions where the selective irradiation occurred and provides the catalyst for subsequent electroless copper deposition at those selective regions. The electroless metallization step uses conventional techniques.

The result is a printed circuit board having fine line, high resolution, interconnections of copper on the order of about one mil wide or larger.

A particularly advantageous feature of this invention is that the resolution of the ultraviolet irradiated regions on the substrate is superb, and corresponds to the resolution of the final copper interconnection geometries. The electroless deposited copper interconnections may be formed having widths as narrow as about one mil with spacings between these interconnections of about the same width.

Other objects and advantages of this invention will be better appreciated from the following detailed description.

DETAILED DESCRIPTION OF THE INVENTION

The method of this invention provides for the formation of fine line, high resolution, geometries of copper, such as for use as electrically conductive interconnections on a printed circuit board. The resulting copper interconnections can be made to have a width as narrow as about one mil (0.001 inch).

A xylene-soluble platinum-containing metallo-organic compound is selectively patterned using ultraviolet radiation. Upon exposure to the radiation, the platinum compound is converted into a xylene-insoluble catalyst precursor. After the original soluble metallo-organic compound is dissolved and removed from all areas of the substrate, the insoluble catalyst precursor is transformed into an active catalyst by firing at an appropriate temperature. Conventional electroless metallization techniques can then be used to build up the copper geometries to the desired thickness.

Although the detailed description of this invention is primarily directed to the electroless deposition of copper, the teachings of this invention are equally applicable to most of the other materials which are deposited using conventional electroless deposition techniques, such as (but not limited to) nickel, nickel/phosphorus alloys, nickel/boron alloys, cobalt, gold and platinum. In fact, the method of this invention has been used to successfully form platinum catalysts for the electroless deposition of nickel/boron interconnections having one mil widths in accordance with the detailed teachings presented here.

More specifically, the preferred method of this invention is as follows.

The preferred metallo-organic solution is a xylene-soluble platinum compound wherein the organic component of the platinum metallo-organic compound is an amine. In particular, tris(1,2-diaminopropane) platinum-(IV) 2-ethylhexanoate, having an elemental formula as follows, [Pt(H$_2$NCH$_2$CH$_2$(NH$_2$)CH$_3$)$_3$][OC(O)CH(C$_2$H$_5$)(C$_4$H$_9$)]$_4$, was employed as the xylene-soluble platinum metallo-organic compound and will be referred to throughout as the "Pt metallo-organic" or the "Pt metallo-organic compound". This Pt metallo-organic compound was synthesized according to the teachings of U.S. Pat. No. 4,201,719 to Liang, entitled "Precious Metal Nitrogenous Organo Reaction Products" issued May 6, 1980, which is incorporated herein by reference. The Pt metallo-organic compound synthesized by this method is a precursor to the photochemical derivative that is subsequently transformed into an active catalyst by pyrolysis, in accordance with the method of this invention.

It should be noted that the exact identification of the platinum metallo-organic compound used in this invention is not known, but is believed to be the one described above. This is a tentative identification based on elemental analysis and thermogravimetric analysis. However, the ultraviolet absorption spectrum of the platinum metallo-organic compound of this invention is more typical of Pt(II) complexes than of the Pt(IV) complex indicated above. In summary, it is believed that the Pt metallo-organic of this invention is the one described above which is the product of the synthesis method taught in Liang, however the exact nature of the compound is not absolutely certain.

The above-described Pt metallo-organic compound is preferred since it is easily isolated during synthesis. This is not true with other platinum metallo-organic complexes. In particular, it is believed that some platinum metallo-organic complexes (although very similar to the preferred Pt metallo-organic) may not produce the desired results when used with the method of this invention, like the preferred Pt metallo-organic. For instance, when 1,3-diamino-propane was substituted for the 1,2-diamino-propane, a platinum product was not isolatable (using the process disclosed in Liang), and therefore not useful to the method of this invention. Further, the neodecanoate of the platinum amine is also currently difficult to isolate and thereby is not preferred. However, it is foreseeable that suitable techniques may arise in the future which permit isolation of the corresponding platinum metallo-organic compounds from these starting materials, and therefore at a later date these materials may become useful with the method of this invention.

In addition, it is to be noted that a platinum imidazole complex, which replaces the 1,2-diaminopropane, is isolatable with 2-ethyl-hexanoate and may therefore also be suitable for the method of this invention. Generally, it is believed that any platinum metal complex of a nitrogenous organic compound selected from the primary, secondary, and tertiary alkyl amines, imidazoles, dipyridyls or amides, which results in the solubility of the complex in a hydrocarbon solvent, could be useful for the formation of catalytically active platinum with the method of this invention. Some specific examples of such are 1,2-diamino cyclohexane, 2,2'-dipyridylamine, 2,2'-bipyrazine, 2,3-diamino toluene, 3,4-diamino toluene and 9,10-diaminophenanthrene.

Also, it is foreseeable that an ultraviolet-sensitive palladium-based metallo-organic catalyst could be formed and used in the method of this invention. Further if cost reductions are desired, they may be achieved by adding a second metal to either the platinum or palladium catalysts since, in fact, palladium based electroless catalysts are often more active when small amounts of tin are present. Also, possible copper, nickel or iron catalysts may be substituted for the precious metals, however this may require additional processing steps. Lastly, silver or gold may be potential candidates as the catalyst with the photochemical method of this invention, however the silver and gold may require special handling procedures due to their light sensitivity.

Therefore, although the specific Pt metallo-organic compound described above is preferred, it is possible that other suitable metallo-organic compounds may be employed with suitable results obtained. The preferred Pt metallo-organic compound was deposited onto a suitable alumina ($Al_2O_3$) substrate. The substrates employed were 99.6% alumina and 96% alumina, wherein the dimensions of the substrates were about one inch by about one inch square (or equivalently about 2.5 X about 2.5 centimeters$^2$). The percent (%) denotes a purity relative to completely pure alumina. Therefore, 99.6% alumina is 99.6% pure as compared to fully pure alumina and 96% alumina is 6% pure as compared to fully pure alumina.

The use of alumina substrates was preferred because alumina is widely used throughout the microelectronics industry, and this is the field to which this invention most pertains. Therefore it was believed that this is the most relevant substrate material to test with this invention. It is foreseeable though that other substrates could be easily used with the method of this invention such as other electrically non-conductive oxide materials like silicon oxide, and also electrically conductive substrates such as silicon or gallium arsenide which are widely used in the microelectronics industry. However, the purpose of this invention, which is to provide a metal catalyst for fine line deposition of electroless copper, is eliminated when an electrically conductive substrate is employed since electroless copper deposition methods are not required with such an electrically conductive substrate. In addition, with some modifications to the method of this invention, it is also foreseeable that certain types of plastic substrates could be used with a slightly modified process that eliminates the high temperature pyrolysis step.

The preferred Pt metallo-organic was deposited onto the substrate by spin coating an ink formed from the Pt metallo-organic compound onto the substrate. In particular, the inks contained about seven to thirty weight percent of the Pt metallo-organic in xylene. Suitable results were obtained using these various weight percents of the preferred Pt metallo-organic, but were dependent upon the purity of the alumina substrate used. The relationship between the substrate and the concentration of the platinum metallo-organic ink is discussed more fully later.

The various inks, containing the preferred platinum amine in the xylene solution, were applied to the alumina substrates by conventional spin-coating techniques. The ink, characterized by a viscosity of about 1.23 centipoise, was applied to the substrate using a dropper-like means, and then spun for about 20 to 30 seconds at about 2000 to 4000 revolutions per minute so as to achieve a uniform thickness of the Pt metallo-organic solution on the substrate.

Next, the platinum metallo-organic ink was selectively irradiated with ultraviolet light in air for a duration sufficient to transform the xylene-soluble, metallo-organic platinum compound into a xylene-insoluble photoproduct derivative. The masks used to effect the selective irradiation were either a copper foil mask having the desired geometries etched into the mask so as to allow transmission of the ultraviolet light through the patterned regions, or alternatively a high resolution quartz mask having the desired geometries patterned with chromium which selectively allowed the desired wavelengths to pass between the chromium regions. The high resolution quartz mask having the chromium patterns is in accordance with Microscopy Resolution Test Chart #2 per the American National Standards Institute (ANSI) and International Standards Organization (ISO); or alternatively, National Bureau of Standards 1010a. The finest features on this test chart are lines and spacings of approximately 0.001" (one mil), or about 28 microns. The mask was placed on top of the platinum metallo-organic ink and substrate, prior to and during irradiation. In addition, a quartz disk, about 0.2 inches thick by about three inches diameter, was placed on the center of the mask to dampen out any vibrations, particularly from the conveyor belt within the ultraviolet apparatus (discussed below).

In actuality, any mask which permits transmission of the desired ultraviolet wavelength may be used, whether the desired wavelength is transmitted alone or within a spectrum of wavelengths. The particular wavelength of interest, 254 nanometers, was determined as follows. A comparison between the ultraviolet absorption spectrum of the platinum amine contained within the Pt metallo-organic of this invention and the spectral output of the ultraviolet lamp, a Fusion Systems H-bulb, indicates an overlap centered around a wavelength of about 254 nanometers. Therefore, it is believed that the absorption of the Pt metallo-organic at this wavelength probably causes the rapid formation of the insoluble derivate of the platinum amine.

A simple test was performed to determine if 254 nanometer light was crucial to the method of this invention. A glass microscope slide, which absorbs deep ultraviolet wavelengths including the 254 nanometer wavelength, was placed over the patterned copper foil mask prior to irradiation, so as to prevent transmission of this wavelength in particular. Platinum compounds are often light sensitive and decomposition may occur at wavelengths longer than the deep ultraviolet, such as in the visible or near ultraviolet spectrums. However, when the glass microscope slide was used, thereby allowing irradiation of the Pt metallo-organic with the longer, visible and near ultraviolet wavelengths, there was no patterning. This is contrary to many conventional platinum compounds which exhibit decomposition at these wavelengths, and further indicates that the 254 nanometer wavelength within the deep ultraviolet spectrum is probably crucial to the transformation of the preferred Pt metallo-organic compound of this invention.

Therefore, the high intensity ultraviolet light, particularly 254 nanometer light, selectively exposes the xylene-soluble platinum metallo-organic ink through the mask. Upon irradiation, the xylene-soluble Pt metallo-organic is transformed into a xylene-insoluble platinum compound.

For all of the ultraviolet irradiations, a Fusion Systems Corporation (Rockville, MD 20855) Style MC-6 conveyor and F 300 lamp housing were employed with the Fusion Systems H-bulb which is a mercury vapor lamp. The lamp housing is positioned over the conveyor belt. The belt speed may be varied from about 4 to about 40 feet per minute (or equivalently about 1.2 to 12.2 meters per minute). The length of the exposure region of the conveyor, whereat the substrate is exposed to the ultraviolet radiation is about six inches (or equivalently about 15 centimeters). Correspondingly, exposure time varied from between about 0.75 seconds to 7.5 seconds, as the conveyor passed through the exposure region. Suitable results were obtained over this range of exposure times, but an exposure time of less than about three seconds is preferred, since exposure times greater than this amount resulted in the loss of resolution in the resulting patterned geometries. All of the substrates were irradiated using a single exposure to the ultraviolet radiation.

After removal of the mask, the original xylene-soluble platinum metallo-organic ink was removed from those areas not to be plated which were accordingly not irradiated by exposure to the ultraviolet wavelengths. The removal was accomplished by simply soaking the substrate in xylene. More specifically, the substrates were soaked in xylene for about ten seconds with ultrasonic agitation and then rinsed for about five seconds with xylene from a wash bottle to ensure thorough removal of the xylene-soluble Pt metallo-organic. The precise duration of this xylene rinsing step may be determined by visual inspection, since the removal of the xylene-soluble metallo-organic ink is readily observed during this step.

A particularly advantageous feature of this invention is that the platinum within the xylene rinses may be reclaimed. Therefore, only the platinum in the selectively irradiated regions, which will serve as the catalytic material for the subsequent electroless copper deposition, is lost with the method of this invention.

After rinsing, the only material remaining on the substrate is in the irradiated regions which consist of an ultraviolet-altered platinum compound. The exact identity of this xylene-insoluble platinum compound (or photoproduct) is not known yet, however, it resembles a skin which is sufficiently adherent to the underlying substrate, so as to allow further processing of the substrate without extraordinary handling procedures. From various tests, it is safe to assume that this platinum compound is not pure platinum or platinum oxide.

Also, it should be noted that both the original xylene-soluble compound and the ultraviolet-altered photoproduct are soluble in iso-propyl alcohol. This indicates that possibly a photonegative process might be achievable with the teachings of this invention for patterning these and other substrates, by suitably modifying the rinse solvents.

This ultraviolet-altered platinum compound was then converted into small clusters, or islands, of catalytically active platinum metal by appropriately pyrolyzing the material at a sufficient temperature. This was accomplished by firing the substrate in an oxygen containing environment, specifically air, at a temperature greater than its decomposition temperature and for a duration sufficient to effect decomposition. It is foreseeable that a nitrogen or hydrogen-containing atmosphere could also be used. In particular, the parts were fired at about 450° C. for about five minutes. Using thermogravimetric analysis, it is believed that the substrates could be pyrolyzed at a temperature as low as about 300° C., which may be desirable if a polymer substrate is being used. In addition, it is believed that the firing temperature for this pyrolysis step should not exceed about 1000° C., although a higher temperature may improve adhesion through the formation of intermetallic particles between the platinum compound and substrate. Further, the duration of the exposure of the substrate to this pyrolysis temperature needs only to be sufficient to burn off the remaining organic components, therefore five minutes at any of these temperatures should be sufficient, although longer periods are not particularly detrimental to the results of this invention.

After pyrolysis the clusters of catalytically active platinum are sufficiently adherent to the substrate to withstand subsequent processing. However, the adhesion of this film could be further enhanced, if desired, by including adhesion promoting metallo-organic compounds, such as $Bi_2O_3$ precursors, within the Pt metallo-organic ink.

In addition, it may be desirable to eliminate this firing step, particularly if polymer substrates are being used. However, two attempts to alleviate this firing step were unsuccessful at producing copper deposition during the subsequent electroless deposition step. No electroless deposition activity was observed when the ultraviolet-treated platinum compound was immersed directly into the electroless copper bath after the xylene rinse. Nor was electroless deposition activity observed when the substrate was soaked in a sodium hydroxide/sodium borohydride bath which is a conventional pretreatment for electroless copper deposition, instead of being fired at the elevated temperature.

It is believed that the ultraviolet-treated platinum compound is catalytically inactive or alternatively, has a water repellency associated with the 2-ethyl-hexanoate group. Therefore, at the present, it is essential that the ultraviolet-treated platinum compound be pyrolized at a sufficiently elevated temperature as described above, so as to produce the catalytically active platinum material. However, in the future, the method of this invention may not require this pyrolysis step at elevated temperatures, and therefore may be applicable with polymer substrates, if a means for activating the ultraviolet-treated platinum compound can be found that does not require heat.

After this pyrolysis step, the catalytically active platinum exists only in those regions where the selective irradiation occurred. The catalytically active platinum provides the catalyst for the subsequent electroless copper deposition, at those selectively irradiated regions.

The electroless copper deposition occurs using conventional techniques. Generally, electroless baths deposit the particular metal (in this case copper) without the use of electrodes. This is accomplished by combining a chemical reducing agent in solution with a salt of the particular metal. The reducing agent provides electrons so as to reduce the oxidation state of the metal ions to zero. The reducing agent, metal salt and various other additives are chosen such that the salt and reductant do not interact in the solution, so as to prevent decomposition of the bath into a suspension of a metal powder. However, the components do react in the presence of a catalyzed surface to produce a metal film. Because the metal films produced this way are themselves catalytic towards the deposition, the thickness of the resulting film can be slowly increased.

The major components of most electroless copper baths are copper sulfate which provides cupric ($Cu^{++}$) ions, and formaldehyde (HCHO) as the reducing agent. The following reaction shows how these compounds combine, in an alkaline solution, to form Cu metal and the formate ion.

$$Cu^{++} + 2HCHO + 4OH^- \rightarrow Cu^0 + H_2 + 2H_2O + 2HCO_2^-$$

This reaction easily occurs when these components are together in solution, so additives such as chelates which bind the $Cu^{++}$ are added to retard the reaction. Since unbound $Cu^{++}$ is then only slowly made available for direct reaction, another pathway to produce metallic Cu (or $Cu^0$) is used. Catalysts do this by reacting with the formaldehyde to produce hydride ions, absorbed on the catalyst surface. These absorbed hydrides are great reducing agents and aggressively reduce $Cu^{++}$ to $Cu^0$.

In particular, the substrates were immersed for about four to eight minutes in a commercially available electroless copper bath, known as PM-994 from Shipley Company, Newton, MA. The PM-994 electroless copper bath deposits copper at a rate of about $2 \times 10^{-3}$ inches per minute but slows considerably as the thickness of the deposit increases.

Using the electroless bath, the copper metal deposited only on the ultraviolet exposed regions where the catalytically active platinum was present. The method of this invention is flexible enough that substrates need not be metallized immediately, since the platinum catalyst is active to electroless metallization both immediately after cooling or even if left out in air for a period of a few days, the longest aging period examined.

With this method, printed circuit boards, having fine line geometries of copper on the order of about one mil, are formed. In particular, geometries having line width resolutions were obtained as follows.

With the 99.6% alumina substrates, this method easily provides patterned copper lines having a one mil width and with a one mil space between the lines. On the 96% alumina substrates, three mil wide lines are easily obtained, with one mil wide lines being a bit more difficult to obtain.

On the 99.6% alumina substrate, the metallo-organic ink having about seven weight percent of the Pt metallo-organic in a balance of xylene, and which was spun onto the substrate at about 3000 revolutions per minute, resulted in the best resolution of the one mil line. This seven weight percent solution required only about 0.75 seconds of exposure to the ultraviolet radiation, which was the shortest time available without modification of the ultraviolet apparatus. An exposure time greater than about three seconds resulted in loss of resolution. In addition, concentrations of less than about three to four weight percent Pt metallo-organic in the ink, also resulted in inferior films.

Spin speeds of between about 2000-4000 revolutions per minute, for deposition of the seven weight percent platinum metallo-organic ink onto the 99.6% alumina, resulted in the desired fine line, high resolution, geometries. Spin speeds over about 4000 revolutions per minute resulted in inferior films, probably due to the excessive thinning of the ink on the surface.

When the platinum metallo-organic ink was spun onto the 99.6% alumina at about 2000 revolutions per minute, the patterned geometries on the substrate exhibited a copper color after only about five seconds in the electroless copper bath, which was indicative of good copper deposition. However, when a spin speed of about 4000 revolutions per minute was used, it took about 20 seconds for the coated substrate to develop a faint copper color that never became very intense, indicating that the copper plating was probably discontinuous. As a comparison, the PM-994 electroless copper bath typically produces a copper color on polymers treated with commercially available palladium-based catalysts in about 30 seconds, which is the application for which the PM-994 bath was developed. Therefore, these results indicate that the Pt catalyst of this invention has a catalytic activity at least as good as conventional and commercial electroless palladium catalysts.

For the 96% alumina substrate, a more concentrated platinum solution was required, i.e., about 30 weight percent of the Pt metallo-organic in xylene, in order to achieve moderately good platability of the copper. It is believed that the rougher surface of the 96% alumina substrate causes excessive light scattering during the irradiation step and a corresponding loss of resolution of the patterned geometries due to the reduced amount of irradiated platinum metallo-organic. Further, this substrate material tended to contain a variety of particle sizes, some even greater than about eight microns across, which generally plate poorly and thereby further degrade the resolution of the copper geometries.

It is believed that the platability of these large particles within the 96% alumina could be improved by using a greater concentration of platinum in the metallo-organic ink, however this would result in a loss of overall resolution. Foreseeably, the resolution could then be improved by the use of exposure times shorter than 0.75 seconds, which would require modification of the ultraviolet apparatus. It is also possible that a glaze be applied to the 96% alumina substrate prior to the deposition of the platinum metallo-organic ink, which would help to level the substrate surface.

X-ray fluorescence analysis shows that good quality copper films are produced with the method of this invention which have between about 0.01 and about 0.02 grams of platinum per meter of copper-coated alumina. This appears to be true regardless of which type of alumina substrate was used, i.e., the 99.6% or 96% alumina substrate. Therefore, the costs associated with the platinum use with this method are minimal.

Typically, the thickness of these patterned fine line, high resolution, copper interconnections will be about 0.1 mil to about 0.5 mil. Therefore, after initial catalyzation by the catalytically active platinum of this invention, the copper will be built up to this desired thickness using any of the known technique, such as probably either by continued electroless deposition or electroplating methods.

If the electroless deposition method is used, it will be self-sustaining since the newly deposited copper will catalyze subsequent copper deposition. However, build-up of any significant thickness, such as the 0.1 to 0.5 mil required, will require a relatively long period of time. Yet, an advantage of this method is that it would eliminate additional handling and processing steps. In addition, continued electroless deposition would probably not require the use of photoresists to prevent copper deposition between the interconnections (such as may occur using other deposition techniques) since electroless deposition would occur only on the previously plated areas.

Alternatively, the build-up of the conductive interconnections could be formed by first briefly immersing the substrate in the electroless copper bath as described above for a few minutes, then following this treatment with conventional electroplating methods. The thickness would be increased more quickly by electroplating copper over the initial electroless deposit. Electrodeposition methods deposit about 0.1 mils thickness of copper in about three to ten minutes, depending upon the particular operating parameters employed. Also, this approach allows for the deposition of any other metals that are commonly electroplated, such as nickel, chromium, iron, tin, lead, zinc, cadmium, silver, gold, palladium, platinum and rhenium, if desired. However, a significant shortcoming associated with the electroplating is that the electrodeposition process results in the quick deposit of electroplated metal in the high current density areas such as at the edges of the metal deposit, and would therefore require prior application of a photoresist between the interconnection lines to avoid metal bridging between the interconnections.

The method of this invention readily facilitates the formation of patterned copper, or other electrolessly deposited metal, interconnections which are characterized by widths of only about mil and spacings therebetween these interconnections of about the same width. A particularly advantageous feature of the method of this invention is that the resolution of the selectively irradiated regions of platinum metallo-organic is extremely fine. Thus the resulting regions of platinum catalyst precursor can be made adaptable to any desired geometry corresponding to the geometry of the resulting copper interconnections.

Therefore, while our invention has been described in terms of a preferred embodiment, it is apparent that other forms could be adopted by one skilled in the art, such as by substituting the constituents of the preferred metallo-organic solution for those previously suggested, or by appropriately modifying the processing parameters employed, or by forming large area metallized regions such as for sensor elements, or by using a polymer substrate and processing accordingly with this method.

Thus, the scope of our invention is to be limited only by the following claims.

The embodiments of the invention in which an exclusive property or privilege is claimed are defined as follows:

1. A method for applying catalytically active metal clusters onto a substrate for subsequent catalysis of electroless copper deposition, for the purpose of providing fine line, high resolution, geometries of copper on the substrate, comprising the steps of:
    depositing a film of a metallo-organic solution onto the substrate, said metallo-organic solution comprising a xylene-soluble platinum amine compound;
    selectively irradiating said xylene-soluble platinum amine compound with deep ultraviolet light for a duration sufficient to selectively transform said xylene-soluble platinum amine compound into a xylene-insoluble platinum compound; platinum amine compound from said substrate; and
    pyrolyzing said xylene-insoluble platinum compound in an oxygen-containing environment at a temperature and for a duration sufficient to thermally decompose said xylene-insoluble platinum compound into clusters of catalytically active platinum;
    such that said catalytically active platinum provides the catalyst for subsequent electroless copper deposition at said selectively irradiated regions, which thereby produce fine line, high resolution, geometries of copper on said substrate.

2. A method for applying catalytically active metal clusters onto a ceramic substrate for subsequent catalysis of electroless copper deposition, for the purpose of providing fine line, high resolution, geometries of copper on the substrate as recited in claim 1 wherein said substrate is alumina.

3. A method for applying catalytically active metal clusters onto a ceramic substrate for subsequent catalysis of electroless copper deposition, for the purpose of providing fine line, high resolution, geometries of copper on the substrate as recited in claim 1 wherein said xylene-soluble platinum amine compound is tris(1,2-diaminopropane) platinum(IV) 2-ethylhexanoate.

4. A method for applying catalytically active metal clusters onto a ceramic substrate for subsequent catalysis of electroless copper deposition, for the purpose of providing fine line, high resolution, geometries of copper on the substrate as recited in claim 1 wherein said deep ultraviolet light includes the wavelength of about 254 nanometers.

5. A method for applying catalytically active metal clusters onto a ceramic substrate for subsequent catalysis of electroless copper deposition, for the purpose of providing fine line, high resolution, geometries of copper on the substrate as recited in claim 1, wherein said pyrolyzing step occurs at a temperature between about 300° C. and about 1000° C. and for a duration of up to about five minutes.

6. A method for applying catalytically active metal clusters onto an alumina substrate for subsequent catalysis of electroless copper deposition, for the purpose of providing fine line, high resolution, geometries of copper on the alumina substrate, comprising the steps of:
    depositing a film of a metallo-organic solution onto the alumina substrate, said metallo-organic solution comprising a xylene-soluble platinum amine compound;
    selectively irradiating said xylene-soluble platinum amine compound with deep ultraviolet light including the wavelength of about 254 nanometers for a duration sufficient to selectively transform said xylene-soluble platinum amine compound into a xylene-insoluble platinum compound;
    rinsing said substrate in xylene for a duration sufficient to remove said remaining xylene-soluble platinum amine compound from said substrate; and
    pyrolyzing said xylene-insoluble platinum compound in an oxygen-containing environment at a temperature between about 300° and 1000° C. for a duration sufficient to thermally decompose said xylene-insoluble platinum compound into clusters of catalytically active platinum;
    such that said catalytically active platinum provides the catalyst for subsequent electroless copper deposition at said selectively irradiated regions, which thereby produce fine line, high resolution, geometries of copper on said substrate.

7. A method for applying catalytically active metal clusters onto a ceramic substrate for subsequent catalysis of electroless copper deposition, for the purpose of providing fine line, high resolution, geometries of copper on the substrate as recited in claim 6, wherein said xylene-soluble platinum amine compound is tris(1,2-diaminopropane) platinum(IV) 2-ethylhexanoate.

8. A method for electrolessly depositing copper onto an alumina substrate comprising the steps of:
    selectively depositing a metal catalyst onto said alumina substrate prior to the electroless deposition of copper onto said alumina substrate, so that said selective contact defines said desired regions of subsequent electroless copper deposition, wherein the improvement comprises the following steps for depositing said metal catalyst onto said alumina substrate:

depositing a film of a metallo-organic solution onto said alumina substrate, said metallo-organic solution being a xylene-soluble platinum amine compound;

selectively irradiating said xylene-soluble platinum amine compound with deep ultraviolet light so as to selectively transform said xylene-soluble platinum amine compound into a xylene-insoluble platinum compound;

removing said remaining xylene-soluble platinum amine compound from said substrate; and pyrolyzing said xylene-insoluble platinum compound in an oxygen-containing environment at a temperature sufficient to thermally decompose said xylene-insoluble platinum compound into catalytically active platinum at said selectively irradiated regions.

9. A method for electrolessly depositing copper onto an alumina substrate as recited in claim 8 wherein said xylene-soluble platinum amine compound is tris(1,2-diaminopropane) platinum(IV) 2-ethylhexanoate.

10. A method for electrolessly depositing copper onto an alumina substrate as recited in claim 8 wherein said deep ultraviolet light includes the wavelength of about 254 nanometers.

11. A method for electrolessly depositing copper onto an alumina substrate as recited in claim 8 wherein said pyrolyzing step occurs at a temperature between about 300° C. and about 1000° C. and for a duration of up to about five minutes.

12. A method for electrolessly depositing copper onto an alumina substrate comprising the steps of:

selectively depositing a metal catalyst onto said alumina substrate prior to the electroless deposition of copper onto said alumina substrate, so that said selective contact defines said desired regions of subsequent electroless copper deposition, wherein the improvement comprises the following steps for depositing said metal catalyst onto said alumina substrate:

depositing a film of a metallo-organic solution onto said alumina substrate, said metallo-organic solution being a xylene-soluble platinum amine compound;

selectively irradiating said xylene-soluble platinum amine compound with deep ultraviolet light containing the wavelength of about 254 nanometers, so as to selectively transform said xylene-soluble platinum amine compound into a xylene-insoluble platinum compound;

rinsing said substrate in xylene for a duration sufficient to remove said remaining xylene-soluble platinum amine compound from said substrate; and pyrolyzing said xylene-insoluble platinum compound in an oxygen-containing environment at a temperature between about 300° C. and 1000° C. for a duration sufficient to thermally decompose said xylene-insoluble platinum compound into catalytically active platinum at said selectively irradiated regions.

13. A method for electrolessly depositing copper onto an alumina substrate as recited in claim 12 wherein said xylene-soluble platinum amine compound is tris(1,2-diaminopropane) platinum(IV) 2-ethylhexanoate.

* * * * *